(12) United States Patent
Abe et al.

(10) Patent No.: US 6,551,398 B2
(45) Date of Patent: Apr. 22, 2003

(54) HEAT TREATMENT METHOD FOR A SILICON MONOCRYSTAL WAFER AND A SILICON MONOCRYSTAL WAFER

(75) Inventors: Takao Abe, Gunma-ken (JP); Norihiro Kobayashi, Gunma-ken (JP); Masahiro Kato, Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/213,017

(22) Filed: Dec. 16, 1998

(65) Prior Publication Data
US 2001/0039915 A1 Nov. 15, 2001

(30) Foreign Application Priority Data
Dec. 17, 1997 (JP) .............................. 9-364142

(51) Int. Cl.$^7$ ........................................... H01L 21/324
(52) U.S. Cl. ......................................................... 117/3
(58) Field of Search ................................. 117/2, 3, 35

(56) References Cited

U.S. PATENT DOCUMENTS

| 5,834,322 A | * | 11/1998 | Fusegawa et al. ............ 438/12 |
| 5,919,302 A | * | 7/1999 | Falster et al. .................... 117/3 |
| 5,935,320 A | * | 8/1999 | Graef et al. ..................... 117/2 |
| 5,968,264 A | * | 10/1999 | Iida et al. ....................... 117/30 |

FOREIGN PATENT DOCUMENTS

| EP | 0 867 928 A2 | 9/1998 |
| JP | 8115919 | 5/1996 |
| JP | 10208987 | 8/1998 |

OTHER PUBLICATIONS

Wolf et al., Silicon Processing for the VLSI Era, vol. 1: Process Technology, Lattice Press, Sunset Beach, CA, USA, Chapter 1, pp. 1–33, 1986.*
Surface Science Technology Series No. 3, UCS, Japan, pp. 185–193, Jun. 28, 1996.*
Kobayashi, et al. "CPO–Free Silicon Surfaces by Rapid Thermal Annealing (RTA) in a H$_2$/Ar Mixture Amient Using High Growth Rate Crystals," XP–000823253; p 430–431.

(List continued on next page.)

Primary Examiner—Benjamin L. Utech
Assistant Examiner—Matthew A. Anderson
(74) Attorney, Agent, or Firm—Hogan & Hartson, LLP

(57) ABSTRACT

There is disclosed a heat treatment method for a silicon monocrystal wafer comprising the steps of heat-treating in a reducing atmosphere a silicon monocrystal wafer manufactured by growing a silicon monocrystal ingot by Czochralski method wherein a wafer obtained from a silicon monocrystal ingot having oxygen concentration of 16 ppma or less which is manufactured by pulling at a growth rate of 0.6 mm/min or more, and in which COPs exist in high density is subjected to anneal heat treatment at 1200° C. or above for one second or more through use of a rapid heating/rapid cooling apparatus, or at 1200° C. or above for 30 minutes or more through use of a batchwise heat treatment furnace, and no defect silicon monocrystal wafer obtained with the method. There can be manufactured a silicon monocrystal wafer in which crystal defects existing on the surface of the wafer or at the surface layer portion thereof are minimized, and there can be provided a silicon monocrystal wafer for a device which is excellent in electric characteristics such as oxide dielectric breakdown voltage and electrical reliability.

16 Claims, 6 Drawing Sheets

OTHER PUBLICATIONS

Stein, et al. "Rapid Thermal Annealing and Regrowth of Thermal Donors in Silicon," J. Appl. Phys. 59 (10), May 15, 1986, p 3495–3502.

Izunome, et al. "Light Point Defects on Hydrogen Annealed Silicon Wafer," Jpn. J. Appl. Phys. vol. 36 (1997) pp. 1127–1129.

Miyazaki, et al. "Microstructure Observation of 'Crystal–Originated Particles' on Silicon Wafers," Jpn. J. Appl. Phys. vol. 34 (1995) pp 6303–6307.

Kato, et al. "Transmission Electron Microscope Observation of 'IR Scattering Defects' in As–Grown Czochralski Si Crystals," Jpn. J. Appl. Phys. vol. 35 (1996) pp. 5597–5601.

* cited by examiner

HEAT TREATMENT METHOD FOR A SILICON MONOCRYSTAL WAFER AND A SILICON MONOCRYSTAL WAFER

BACKGROUND OF INVENTION

1. Field of the Invention

The present invention relates to a heat treatment method for a silicon monocrystal wafer obtained by slicing a silicon monocrystal ingot grown by a Czochralski method (hereinafter referred to as "CZ method"), and a silicon monocrystal wafer wherein crystal defect density is significantly reduced by the method.

2. Description of the Related Art

As a method for eliminating crystal defects of a silicon monocrystal wafer, there has been adopted a method in which a wafer is subjected to hydrogen anneal at a high temperature. In this method, oxide precipitate is intentionally reduced with hydrogen and dissolved, and thus surface oxide-film is eliminated, resulting in increasing oxygen out-diffusion speed, so that defects can be eliminated. However, it is known that even if the hydrogen anneal is performed under the typical condition that a temperature is 1200° C. and treatment time is 60 minutes, since crystal defects and oxide precipitates remain near the surface of the wafer, oxygen is continuously out-diffused from inside to outside, and oxide precipitates are re-formed. Further, this method strongly depends on history of crystal before hydrogen anneal treatment, and therefore the wafer having less crystal defects has been selected as a wafer which is to be subjected to hydrogen anneal treatment.

As an another method, there has been adopted a method in which crystal defects are eliminated by lowering a growth rate of monocrystal. However, according to this method, although the number of crystal defects can be decreased, electronic characteristics such as oxide dielectric breakdown voltage of a device are degraded since the size of the defect is increased.

As described above, it is difficult to eliminate crystal defects sufficiently, even when the silicon monocrystal wafer is subjected to hydrogen anneal. Furthermore, lowering the pulling rate results in increase of the defect size, and therefore it is difficult to eliminate defects with hydrogen anneal.

Meanwhile, COPs (Crystal Originated Particles) have recently been cited as a cause of decreasing the yield of a device-fabricating process. COP is one type of crystal defects that are introduced in a crystal during the growth thereof and is known to be a defect of vacancy type having a regular octahedron structure void or cavity.

When a silicon wafer having COPs subjected to mirror-polishing is cleaned through use of a mixture solution of ammonia and hydrogen peroxide, pits are formed in the wafer surface. When the number of particles on the wafer is measured through use of a particle counter, pits are also detected and counted as particles together with real particles. The thus-detected pits are called "COPs" in order to distinguish them from the actual particles.

COPs existing at the surface layer portion of a wafer degrade the electric characteristics of the wafer. For example, a time dependent dielectric breakdown (TDDB) of oxide film, one important electric characteristic of a semiconductor device determined through a reliability test, is known to be related to COPs, and therefore reduction of COPs is required in order to improved the time dependent dielectric breakdown.

Also, COPs are said to affect an ordinary time zero dielectric breakdown (TZDB) of oxide film.

Moreover, COPs are said to adversely affect the device-fabricating process. For example, if COPs exist at the surface layer portion of a SOI (Silicon On Insulator) wafer, buried oxide film is etched by etchant or atmosphere gas passed through the COPs during an etching process or a heat treatment process, and a step is formed during a wiring process, and the thus-formed step causes breakage of wiring, resulting in a decrease in yield.

A hydrogen anneal is known as a method for reducing the COPs. However, even if anneal is conducted under the typical treatment condition, COPs at the surface layer portion of the wafer can not be completely eliminated, but partly remain. Furthermore, COPs also remain at relatively near area to the surface.

The reason of why COPs at the surface layer portion of the wafer can not be completely eliminated is, for example, that COPs remain in the wafer even when high temperature hydrogen anneal is conducted at 1200° C., for 60 minutes, and later, internal COPs come to appear on the surface as a result of that the surface is etched during hydrogen anneal. COPs which come to appear on the surface right before the temperature begins to be lowered are difficult to be eliminated while the temperature is falling, and the COPs which come to appear on the surface while the temperature is falling are more difficult to be eliminated. In order to prevent COPs from appearing while the temperature is falling, it is necessary to raise the temperature falling rate.

Because, silicon is generally etched in a thickness of about 0.5 $\mu$m through hydrogen anneal at 1200° C. for 60 minutes, and etching rate decreases and migration on the surface of the silicon get small, as temperature lowers. And therefore, COP appearing on the surface while the temperature is lowering is not etched, and is difficult to be eliminated.

Alternatively, in order to reduce COPs, it is necessary to prepare a wafer having COPs which can be easily eliminated by hydrogen anneal, and for that purpose, it is necessary to study thoroughly the condition for pulling silicon monocrystal ingot which is to be used for preparation of a wafer. In the prior art, a growth rate of monocrystal is lowered in order to reduce defects such as COP. However, in this case, although the number of COP can be decreased, the size thereof gets large, and therefore, the probability that COPs are not eliminated is high even if the wafer prepared from the monocrystal ingot thus obtained is subjected to hydrogen anneal. Therefore, it is difficult to eliminate COP defects by the existing technique.

SUMMARY OF THE INVENTION

The present invention has been accomplished to solve the above-mentioned problems, and an object of the present invention is to manufacture a silicon monocrystal wafer in which crystal defects existing on the surface of the wafer or at the surface layer portion thereof are minimized, and to provide a silicon monocrystal wafer for a device which is excellent in not only oxide dielectric breakdown voltage but also other electric characteristics such as electrical reliability.

Another object of the present invention is to enable production of a silicon monocrystal wafer having no defect, and to achieve enhancement of productivity, reduction in the amount of hydrogen to be used, cost reduction, and the like.

To achieve the above object, the present invention relates to a heat treatment method for a silicon monocrystal wafer comprising the steps of heat-treating in a reducing atmosphere a silicon monocrystal wafer manufactured by slicing a silicon monocrystal ingot which is grown by Czochralski method wherein a wafer obtained by slicing a silicon monocrystal ingot having oxygen concentration of 16 ppma or less which is manufactured by pulling at a growth rate of 0.6 mm/min or more, and in which COPs exist in high density is subjected to anneal heat treatment at 1200° C. or above for one second or more through use of a rapid heating/rapid cooling apparatus.

The rapid heating/rapid cooling means, for example, a method that a wafer is immediately loaded into a heat treatment furnace in which a temperature is arranged in the above-mentioned range, and is immediately loaded out upon elapse of the above-mentioned heat treatment time, or a method that a wafer is immediately subjected to heat treatment with a lump heater or the like after it is arranged at a predetermined position in the heat treatment furnace. The language reading "immediately loaded into" or "immediately loaded out" means that there are not performed an operation for raising and lowering the temperature over a certain period, as well as a conventional so-called loading or unloading operation in which a wafer is slowly loaded into the heat treatment furnace and slowly loaded out. Of course, it takes a certain time to bring a wafer to a predetermined position in the furnace, for example, several seconds to several minutes depending on capability of a transfer apparatus for loading of a wafer. The apparatus having the above-mentioned function is called a rapid thermal annealer (hereinafter abbreviated to "RTA apparatus").

As described above, a silicon monocrystal ingot having an oxygen concentration of 16 ppma or less in which COPs exist in high density is manufactured by pulling a silicon monocrystal ingot by CZ method at a high growth rate of 0.6 mm/min or more, preferably 0.8 mm/min or more. Then, the wafer obtained by slicing the silicon monocrystal ingot thus manufactured is subjected to anneal heat treatment with a rapid heating/rapid cooling apparatus in a reducing atmosphere at a temperature of 1200° C. or above for one second or more, so that there can be obtained the wafer in which COPs on the surface and at the surface layer portion thereof are significantly reduced. Accordingly, there can be obtained a device that not only oxide dielectric breakdown voltage but also other electric characteristics such as electrical reliability are significantly improved. Furthermore, a wafer having a large diameter in which COPs is especially difficult to be reduced can be treated in a short time, and therefore, enhancement of productivity is achieved, and safety is improved since an amount of hydrogen gas to be used can be decreased.

The present invention also relates to a heat treatment method for a silicon monocrystal wafer comprising the steps of heat-treating in a reducing atmosphere a silicon monocrystal wafer manufactured by slicing a silicon monocrystal ingot which is grown by Czochralski method wherein a wafer obtained by slicing a silicon monocrystal ingot having oxygen concentration of 16 ppma or less which is grown at a growth rate of 0.6 mm/min or more, preferably 0.8 mm/min or more, and in which COPs exist in high density is subjected to anneal heat treatment at 1200° C. or above for 30 minutes or more through use of a batchwise heat treatment furnace.

A batchwise heat treatment furnace means a furnace in which a heat treatment is performed in a so-called batchwise operation, that is, plural wafers are placed on plural shelves provided in the vertical type heat treatment furnace, hydrogen gas is then introduced therein, temperature in the furnace is raised relatively slowly, and then heat treatment is performed at a predetermined temperature for a predetermined period, followed by lowering the temperature relatively slowly. When using the batchwise furnace, a large amount of wafers can be subjected to heat treatment. However, one cycle additionally including time for loading in and loading out of the wafer is long, and therefore productivity is not so excellent as that of RTA apparatus. However, it is excellent in controllability of temperature so that stable operation can be achieved.

When the wafer manufactured from the silicon monocrystal ingot having the similar quality to one of the ingot used in the above described method using a rapid heating/rapid cooling apparatus is subjected to anneal heat treatment using the batchwise heat treatment furnace at the temperature of 1200° C. or above, for 30 minutes or more, COPs on the surface and at the surface layer portion thereof are significantly reduced, electric characteristics of the device such as oxide dielectric breakdown voltage, electrical reliability or the like are significantly improved. Furthermore, as for a wafer having large diameter, enhancement of productivity and cost reduction are achieved.

In this case, COPs existing in high density in a silicon monocrystal to be subjected to the heat treatment preferably have a size of 60–130 nm, and preferably consist of only one void.

The silicon monocrystal in which such a fine COPs exist in high density can be easily manufactured by pulling at 0.6 mm/min or more, preferably 0.8 mm/min or more. Furthermore, when monocrystal has oxygen concentration of 16 ppma or less, almost no oxide film exists in the inner wall of COP, and therefore, COPs can be eliminated quite easily with hydrogen anneal heat treatment of the wafer.

Furthermore, oxygen concentration in the monocrystal can be controlled by adjusting a rotating number of a crucible containing silicon melt therein as a raw material, a rotating number of a growing monocrystal, quantity of flow of inert gas, temperature of melt, or the like.

The present invention also relates to a heat treatment method of a silicon monocrystal wafer wherein the silicon wafer having COPs of a size of 60–130 nm is subjected to heat treatment in a reducing atmosphere at a temperature of 1200° C. or above. Furthermore, the present invention relates to a heat treatment method of a silicon monocrystal wafer wherein the silicon wafer wherein COP is crystal defect consisting of only one void is subjected to a heat treatment in a reducing atmosphere at a temperature of 1200° C. or above.

Such a fine COP, or COP which is crystal defect consisting of only one void can be easily eliminated by high temperature heat treatment in a reducing atmosphere, regardless of a method for manufacturing a wafer.

In an embodiment, when the above mentioned reducing atmosphere is 100%-hydrogen atmosphere, or a mixed atmosphere of hydrogen and argon, sufficient effect of hydrogen anneal heat treatment can be obtained, COPs having oxide film on the inner wall can be significantly decreased, and a void can be filled with silicon, so that almost no defect wafer can be provided.

Furthermore, the present invention relates to a silicon monocrystal wafer in which COPs are eliminated by the method described above.

In the silicon monocrystal wafer manufactured by the heat treatment method described above, since the size of COP is small, oxide film on the inner wall of COP can be reduced and dissolved by hydrogen surely diffused from the surface of the wafer thereto by hydrogen anneal, a void can be filled with silicon supplied from the surface of the wafer to be eliminated, and thus COPs can be eliminated, so that actually no defect silicon monocrystal wafer can be provided. Accordingly, characteristics of a device is improved, yield is improved, so that quite useful silicon monocrystal wafer can be provided.

According to the present invention, a wafer obtained by slicing a silicon monocrystal ingot having oxygen concentration of 16 ppma or less which is manufactured by pulling at a growth rate of 0.6 mm/min or more, and in which COPs exist in high density is subjected to high temperature heat treatment in a reducing atmosphere through use of a rapid heating/rapid cooling apparatus or a batchwise heat treatment furnace, so that COPs on the surface and at the surface layer portion can be significantly reduced and thus the no defect wafer can be manufactured. Accordingly, the wafer is quite valuable as a wafer for a device which is excellent in electrical characteristics. Furthermore, especially for a large diameter wafer, since high speed pulling can be performed, it is possible to achieve enhancement of productivity and cost reduction by selecting the monocrystal growing condition and hydrogen anneal condition appropriately. Moreover, reduction in the amount of hydrogen to be used can be achieved.

DESCRIPTION OF THE INVENTION AND A PREFERRED EMBODIMENT

Figure 1:
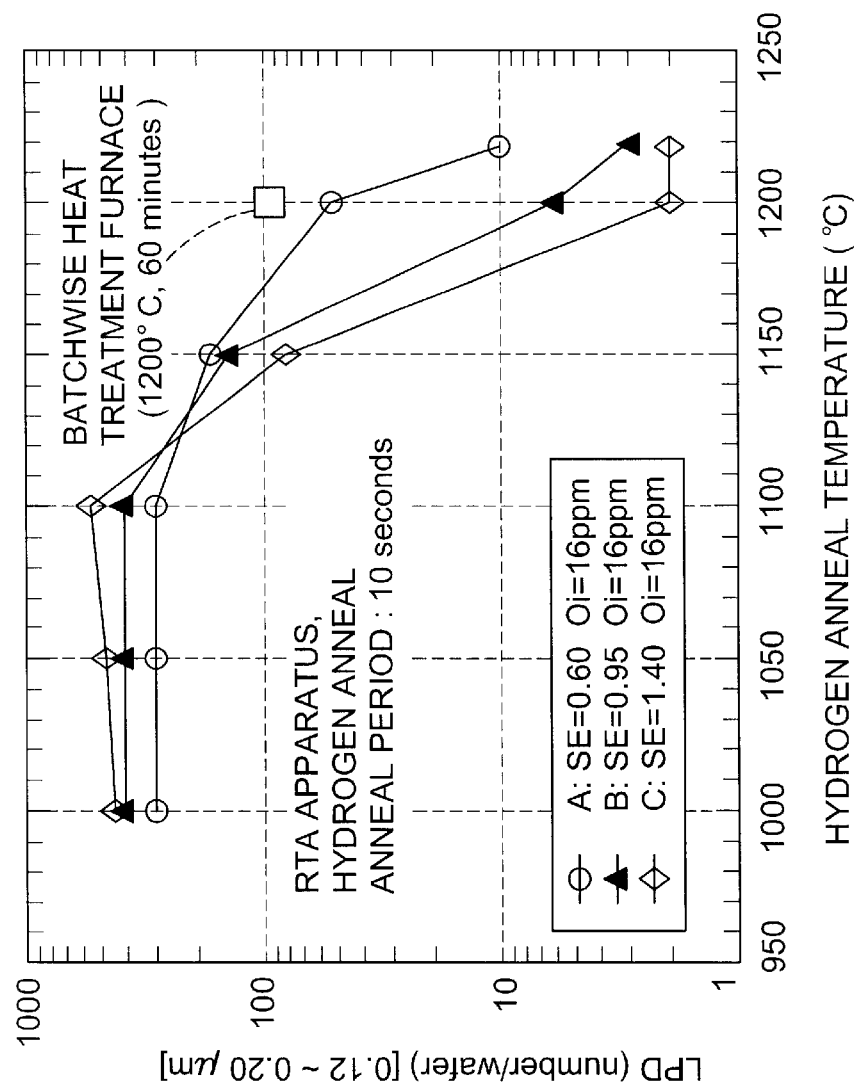
FIG. 1 is a graph showing the relationship between heat treatment temperature and the number of LPD (COP) on the surface of the wafer after hydrogen anneal heat treatment by the rapid heating/rapid cooling apparatus.

The present invention will be further described below in detail, but is not limited thereto.

The present inventors carried out various experiments and studies to find heat treatment conditions that can reduce the density of COPs existing at the surface layer portion of a silicon wafer, and found that when a monocrystal ingot in which fine COPs exist in high density is manufactured by pulling a monocrystal having low oxygen concentration at high speed, and then the resultant wafer is subjected to hydrogen anneal, COP density is significantly lowered, so that no defect silicon monocrystal wafer can be obtained. The present invention was accomplished based on this finding.

Basic idea about the present invention is based on the following findings.

Namely, Laser Scattering Tomography Defect (LSTD) in the silicon monocrystal pulled under a general condition in CZ method was previously observed with a transmission electron microscope (TEM), and it was reported that COP had a shape that two or three of regular octahedral voids surrounded by thin oxide film having a thickness of 2–4 nm were linked, and had a size of 100–300 nm (M. Kato et al.; Jpn. Appln. Pys. 35 (1996) 5597).

However, further studies have revealed that there exists only one independent single type defect, when LSTD in CZ crystal cooled rapidly is observed. The single type defect is also a regular octahedral void sized 60–130 nm. The oxide film is thinner than that obtained by general cooling as in the above-mentioned conventional method, or does not exist in some cases.

Furthermore, it has been found that the single type defects generate at an early stage of defect growing, and twin or triplet type defects generate in the subsequent stage.

FIG. 5 is a schematic view showing the step that the twin type void is growing. In the cooling step of a growing monocrystal, first, vacancy 20 begin to aggregate to form a fine void as shown in (a). Then, the void absorbs vacancy which is diffused thereto, and grows while interstitial oxygen 21 gathers around the void to form thin oxide film 22 as shown in (b). The oxide film surrounds the void, and prevents the vacancy from being absorbed therein as shown in (c) and (d). Then, the vacancy begins to attack the weakest site of the oxide film to make the defect grow. Then, at the weakest site, the second void 23 begins to be distended to form the twin type void as shown in (e).

The difference between the condition for forming void of single type and that for forming twin or triplet type void is as follows. When the crystal is pulled at high speed and cooled rapidly, a lot of small single type voids are formed. In this case, oxide film at inner wall of COP is quite thin or does not exist when oxygen concentration is low. When the crystal is pulled at low speed and cooled slowly, smaller number of twin or triplet type voids are formed. In that case, the oxide film at the inner wall of COP tends to be thick.

Further analysis of the above phenomenon revealed the followings. In the past, it is attempted to decrease defects such as COPs and the like by growing monocrystal at low speed, and subjecting a wafer to hydrogen anneal to eliminate remaining large twin or triplet type COP defects. However, it is difficult to eliminate the COPs with hydrogen anneal, since the COPs are too large, and the thick oxide film exists on the surface of the COP. On the contrary, according to the present invention, monocrystal having low oxygen concentration is grown at high speed to provide a monocrystal ingot in which there exist a lot of single type COP having no oxide film or thin oxide film if any. In that case, COP can be easily eliminated completely with a heat treatment, namely hydrogen anneal of the wafer.

According to the present invention, the pulling rate is 0.6 mm/min or more, preferably 0.8 mm/min or more, so that a lot of single type COPs having small size as 60–130 nm can generate, and growing to the twin or triplet type COP can be well prevented. Therefore, the pulling rate is preferably as fast as possible, for example 1.0 mm or more, depending on the diameter of the pulled crystal. If the pulling rate is less than 0.6 mm, the crystal is cooled too slowly, and therefore COPs grow to the twin type or triplet type and the oxide film at the inner wall of COP get harder, although the number of COPs is decreased. The single type COP has a size of approximately 60–130 nm, and has no oxide film at the inner wall in most cases when the oxygen concentration is low.

Oxygen concentration in the silicon monocrystal ingot is preferably up to 16 ppma (JEIDA: Japan Electronic Industry Development Association), especially up to 10 ppma. When oxygen concentration is more than 16 ppma, oxide film gets thick, resulting in insufficient elimination of COPs in the hydrogen anneal step, and longer heat treatment time, which may affect adversely on the quality and productivity of the wafer.

Oxygen concentration in the silicon monocrystal ingot can be controlled easily by conventional methods, for example, by adjusting quantity of flow of inert gas, rotating number of crucible, a rotating number of a growing monocrystal, temperature of silicon melt, or the like.

Subsequently, a silicon wafer is produced by slicing the above mentioned silicon monocrystal, and subjecting it to a heat treatment with a rapid heating/rapid cooling apparatus (RTA apparatus) or a batchwise apparatus in a reducing atmosphere of 100% hydrogen or a mixed atmosphere of hydrogen and argon at 1200° C. or above for one second or more in the case of a RTA apparatus or for 30 minutes or more in the case of the batchwise apparatus, so that COP density is significantly decreased. Especially the COP density can be decreased to zero by this condition. When the wafer subjected to above described hydrogen anneal is used, there can be produced a device which is excellent in not only oxide dielectric breakdown voltage but also other electric characteristics such as a time dependent dielectric breakdown.

An embodiment of the present invention will now be described with reference to the drawings. However, the present invention is not limited thereto.

Examples of an apparatus which can heat and cool a silicon wafer rapidly used in a hydrogen anneal step of the present invention include: heater such as a lamp heater with heat radiating, a laser heater with a laser beam, a X-ray heater using X-ray, a resistance heater. An example of commercially available apparatuses is SHS-2800 (product of AST corp.). These apparatuses are neither extremely complicated nor expensive.

Figure 6:
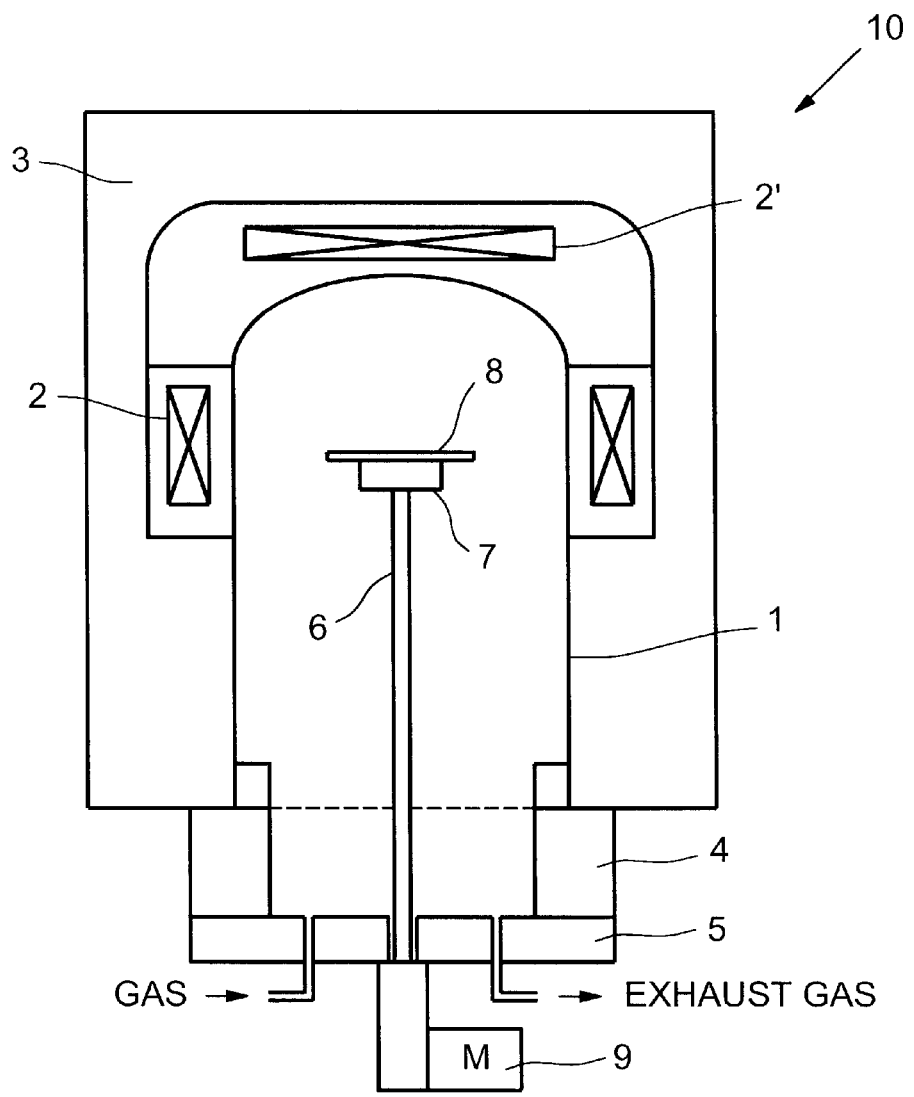
FIG. 6 is a schematic view showing an example of a heat treatment furnace which can heat and cool a silicon wafer rapidly.

First, a description will be given of rapid heating/rapid cooling apparatus used in the present invention. FIG. 6 is schematic sectional view of a resistance heating type rapid heating/rapid cooling apparatus.

A heat-treatment furnace 10 shown in FIG. 6 includes a bell jar 1 which is formed from, for example, silicon carbide or quarts and in which a wafer is heat-treated. Heaters 2 and 2' surround the bell jar 1 so as to heat the bell jar 1. The heater 2' is separated from the heater 2 along a vertical direction. Also, power supplied to the heater 2' is independent of that to the heater 2 for independent power control between the heaters 2 and 2'. The heating method is not limited thereto, but so-called radiation heating and induction heating may also be applicable. The bell jar 1 and the heaters 2 and 2' are housed in a housing 3 serving as a heat shield.

A water-cooled chamber 4 and a base plate 5 are arranged at the lower portion of a furnace so as to isolate the interior of the bell jar 1 from the atmosphere. A wafer 8 is held on a stage 7, which is attached to the top end of a support shaft 6, which, in turn, is moved vertically by means of a motor 9. In order to load a wafer into or unload from the furnace along a horizontal direction, the water-cooled chamber 4 has an unillustrated wafer port which is opened and closed by means of a gate valve. A gas inlet and a gas outlet are provided in the base plate 5 so that the gas atmosphere within the furnace can be adjusted.

In the heat treatment furnace 10 having the above-described structure, heat treatment for rapid heating/rapid cooling of a silicon wafer is carried out in the procedure described below.

First, the interior of the bell jar 1 is heated to a desired temperature of 1200° C. or above by the heaters 2 and 2' and is then held at the desired temperature. Through mutually independent control on power supplied to the heaters 2 and 2', a temperature distribution can be established within the bell jar 1 along a vertical direction. Accordingly, the heat-treatment temperature of a wafer is determined by the position of the stage 7, i.e. the amount of insertion of the support shaft 6 into the furnace.

In a state in which the interior of the bell jar 1 is maintained at a desired temperature, a wafer is inserted into the water-cooled chamber 4 through the wafer port by an unillustrated wafer handling apparatus arranged next to the heat treatment furnace 10. The inserted wafer is placed in, for example, a SiC boat provided on the stage 7 which is situated at the bottom standby position. Since the water-cooled chamber 4 and the base plate 5 are water-cooled, the wafer located at this standby position is not heated to a high temperature.

Upon completion of placing the wafer on the stage 7, the motor 9 is immediately driven to insert the support shaft 6 into the furnace so that the stage 7 is raised to a shaft 6 into the furnace so that the stage 7 is raised to a heat treatment position where a desired temperature in the range of 1200° C. or above is established, thereby heat-treating the wafer at the temperature. In this case, since only approximately 20 seconds, for example, is required for moving the stage 7 from the bottom standby position in the wafer-cooled chamber 4 to the heat treatment position, the silicon wafer is heated quickly.

The stage 7 is halted at the desired temperature position for a predetermined time (one second or more), thereby subjecting the wafer to high-temperature heat treatment over the halting time. Upon elapse of the predetermined time to complete high-temperature heat treatment, the motor 9 is immediately driven to withdraw the support shaft 6 from the interior of the furnace to thereby lower the stage 7 to the bottom standby position in the water-cooled chamber 4. This lowering motion can be completed in approximately 20 seconds, for example. The wafer on the stage 7 is quickly cooled, since the water-cooled chamber 4 and the base plate 5 are water-cooled. Finally, the wafer is unloaded from inside the water-cooled chamber 4 by the wafer handling apparatus, thus completing the heat treatment.

When there are more wafers to be heat-treated, these wafers can be sequentially loaded into and heat-treated in the heat treatment furnace 10 maintained at a predetermined high temperature.

Through use of the above-described rapid heating/rapid cooling apparatus, silicon wafers were heat treated in a single-wafer processing scheme in a 100% hydrogen atmosphere.

The wafers used in the present embodiment were sliced in a commonly practiced manner from a silicon ingot having oxygen concentration of up to 16 ppma in which COPs having a size of 60–130 nm exist in high density, that had been manufactured in accordance with the above-mentioned Czochralski method at a pulling rate of 0.8 mm /min to 1.2 mm/min, and were then subjected to mirror-polishing. The wafers each had a diameter of 8 inches and a <100> orientation.

The reducing atmosphere can be 100% hydrogen gas, or a mixed atmosphere of hydrogen and argon, the latter may be selected in order to control reducing force of hydrogen, to prevent generation of slip dislocation or by the other reasons such as aspect of safety.

The heat treatment was conducted in a temperature of 1200° C. or above for period of time one second or more. The temperature less than 1200° C. is not enough to eliminate COP completely. The time less than one second is not enough to achieve heat treatment effect.

As described above, the wafer prepared by subjecting the wafer having small COPs to hydrogen anneal through use of RTA apparatus has almost no COP, especially at the surface layer portion, so that a no defect silicon monocrystal wafer can be manufactured. Accordingly, by using the wafer subjected to hydrogen anneal, there can be prepared a device which is excellent in electrical characteristics such as oxide dielectric breakdown voltage, a time dependent dielectric breakdown, or the like.

When the RTA apparatus is used, temperature is raised quite rapidly so that it takes quite short time to reach the temperature at which COP can be eliminated, and therefore, COPs may be eliminated easily even when a lot of single type COPs exist.

A batchwise heat treatment furnace can also be used for hydrogen anneal. The batch type heat treatment furnace means so called batchwise heat treatment wherein wafers are placed in the vertical type or the horizontal type heat treatment furnace, hydrogen gas is introduced therein, the interior of the furnace is mildly heated, and then the heat treatment is performed at a predetermined temperature for a predetermined period, followed by descending the temperature relatively slowly. When using the batchwise furnace, a large amount of wafers can be subjected to the heat treatment at once. However, one cycle additionally including time for loading in and loading out of the wafer is long, and therefore productivity is not always excellent. However, it is excellent in controllability of temperature so that stable operation can be achieved.

The condition for hydrogen anneal through use of a batchwise heat treatment furnace is basically same as that for the above-mentioned RTA apparatus, namely, in 100% hydrogen gas atmosphere or in a mixed atmosphere of argon and hydrogen, at 1200° C. or more. Heat treatment time is preferably 30 minutes or more. The heat treatment less than 30 minutes cannot provide sufficient effect, namely, COPs cannot be eliminated sufficiently.

As described in the above, even when the batchwise vertical type heat treatment furnace is used, there can be eliminated almost completely COPs at the surface layer portion of the wafer prepared by subjecting a wafer in which small COPs exist, so that no defect silicon monocrystal wafer can be manufactured. Accordingly, by using the wafer subjected to hydrogen anneal, there can be fabricated a semiconductor device which is excellent electrical characteristics such as oxide dielectric breakdown voltage, time dependent dielectric breakdown, or the like.

In the measurement by another method, total number of COPs at the surface layer portion (from the surface of the wafer to the depth of 0.5 $\mu$m) was decreased to about half an amount. Accordingly, a batchwise apparatus or a RTA apparatus can be used depending on purpose.

EXAMPLES

The following examples and comparative examples are being submitted to further explain the present invention. These examples are not intended to limit the scope of the present invention.

Example 1

With the pulling rate (SE: seed elevation) of the silicon monocrystal set in three stages, that is 0.6, 0.95, 1.4 mm/min, the monocrystal ingot having oxygen concentration (Oi) of 16 ppma and a diameter of 8 inches was pulled, and a wafer was prepared therefrom. The wafer was then subjected to hydrogen anneal at a temperature of 1000 to 1200° C. COPs existing at the surface layer portion of the wafer was measured in LPD (Light Point Defect) mode of a light scattering apparatus.

The results were shown in FIG. 1 and as follows: when the wafer was subjected to hydrogen anneal in 100% hydrogen atmosphere, at 1200° C., for 10 seconds through use of a RTA apparatus (SHS-2800), the numbers of COPs of size of 0.20 to 0.12 $\mu$m at the surface layer portion of the wafer were respectively 50, 6, 2 per a wafer. Namely when the pulling rate is higher, more COPs were eliminated. When the wafer manufactured under the condition that SE (pulling rate) is 1.4 mm/min, and Oi is 16 ppma was subjected to hydrogen anneal in 100% hydrogen atmosphere, at 1200° C. for one hour with a batch wise heat treatment furnace, the number of COPs was 90 per a wafer.

These results show that a heat treatment is preferably performed at a temperature of 1200° C. or above, that when the wafer manufactured by high speed pulling is subjected to hydrogen anneal, LPD(COP) defects can be easily reduced, and therefore that the wafer having less COPs can be obtained. Furthermore, it is found that the pulling rate is slower than 0.6 mm/min, although it depends on the diameter of the pulled crystal, COP grows too much to achieve the effect of hydrogen anneal.

Example 2

The importance is in the total number of COPs at the surface layer portion in depth of up to 0.5 $\mu$m which becomes a surface after device fabrication affecting the device. However, it cannot be counted directly with a particle counter at once. Therefore, oxide film is formed in several stages of thickness by a thermal oxidation treatment, and the number of COPs in silicon is counted via the oxide film with a particle counter to calculate an integral value in depth direction. For example, the oxide film was grown to the thickness of 1.0 $\mu$m in several stages, and the total number (an integral value) of COPs existing in the depth of up to 0.5 $\mu$m from the surface was measured (Hereinafter referred to as "oxide film method".

Figure 2:
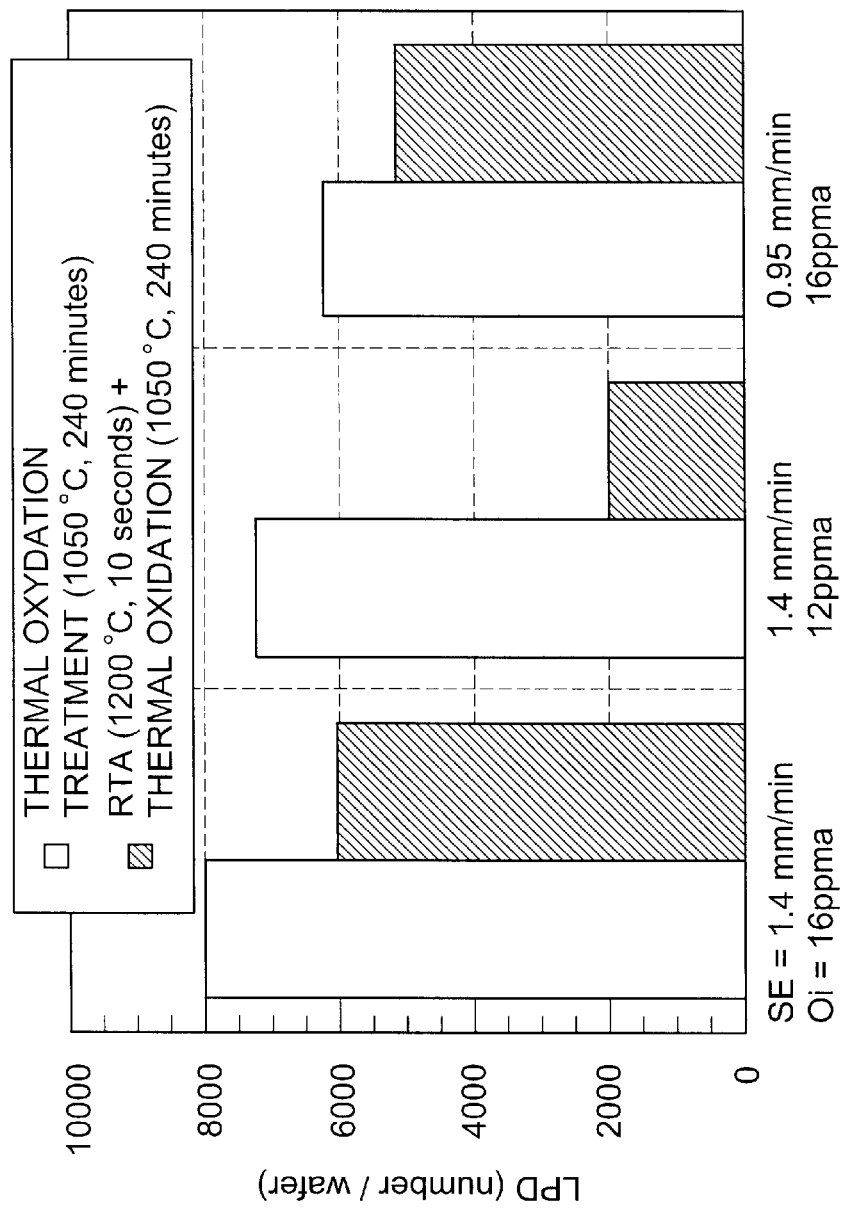
FIG. 2 is a graph comparing LPD (COP) (number/wafer) at the surface layer portion of the wafer before and after hydrogen anneal in each pulling condition of the silicon monocrystal.

FIG. 2 shows effect of hydrogen anneal measured with COP measurement by the oxide film method. Silicon monocrystal was pulled at a rate of 1.4, 1.4, 0.95 mm/min to produce the wafers wherein oxygen concentration was 16, 12, 16 ppma respectively. The resultant wafers were subjected to thermal oxidation treatment to provide samples on which surface an oxide ($SiO_2$) film having thickness of up to 0.95 $\mu$m was formed. The number of COPs at the surface layer portion of them was counted by the oxide film method. On the other hand, other three wafers were prepared by the same method as described above, and were subjected to hydrogen anneal in 100%-hydrogen atmosphere, at 1200° C. for 10 seconds through use of RTA apparatus. The wafers were then subjected to thermal oxidation treatment as described above to form an oxide film having thickness of up to 0.95 $\mu$m. COPs at the surface layer portion of the wafer was measured by the oxide film method.

The results were shown in FIG. 2. In FIG. 2, LPD[COP] (number/wafer) at the surface layer portion of the wafer before and after hydrogen anneal in each pulling condition of the silicon monocrystal is shown as a bar chart. As is clear from FIG. 2, when the pulling rate is fast as 1.4 mm/min, and oxygen concentration is 12 ppma, the largest reducing rate of the number of LPD (72%) can be achieved. Among the wafers which were not subjected to hydrogen anneal, the wafer manufactured by pulling crystal at a rate of 0.95 mm/min has the least LPD (approximately 6200/wafer). However, in the same wafers except that they were subjected to hydrogen anneal, a reducing rate of the number of LPD was the smallest (approximately 18%). These results reveals the following facts. When crystal is grown slowly, the number of COPs may get small, but the size of COP gets large, and in that case, COPs cannot be easily reduced. On the contrary, when crystal is grown fast, the number of COPs may get large, but the size of COPs gets small, and in that case, COPs can be easily reduced. When oxygen concentration is low, COPs can be easily reduced. Accordingly, it is the most effective for reducing COPs with hydrogen anneal to use the wafer having low oxygen concentration manufactured by pulling crystal at high speed.

Example 3

The effect of hydrogen anneal with RTA apparatus is compared with that with a batchwise heat treatment furnace.

Figure 3:
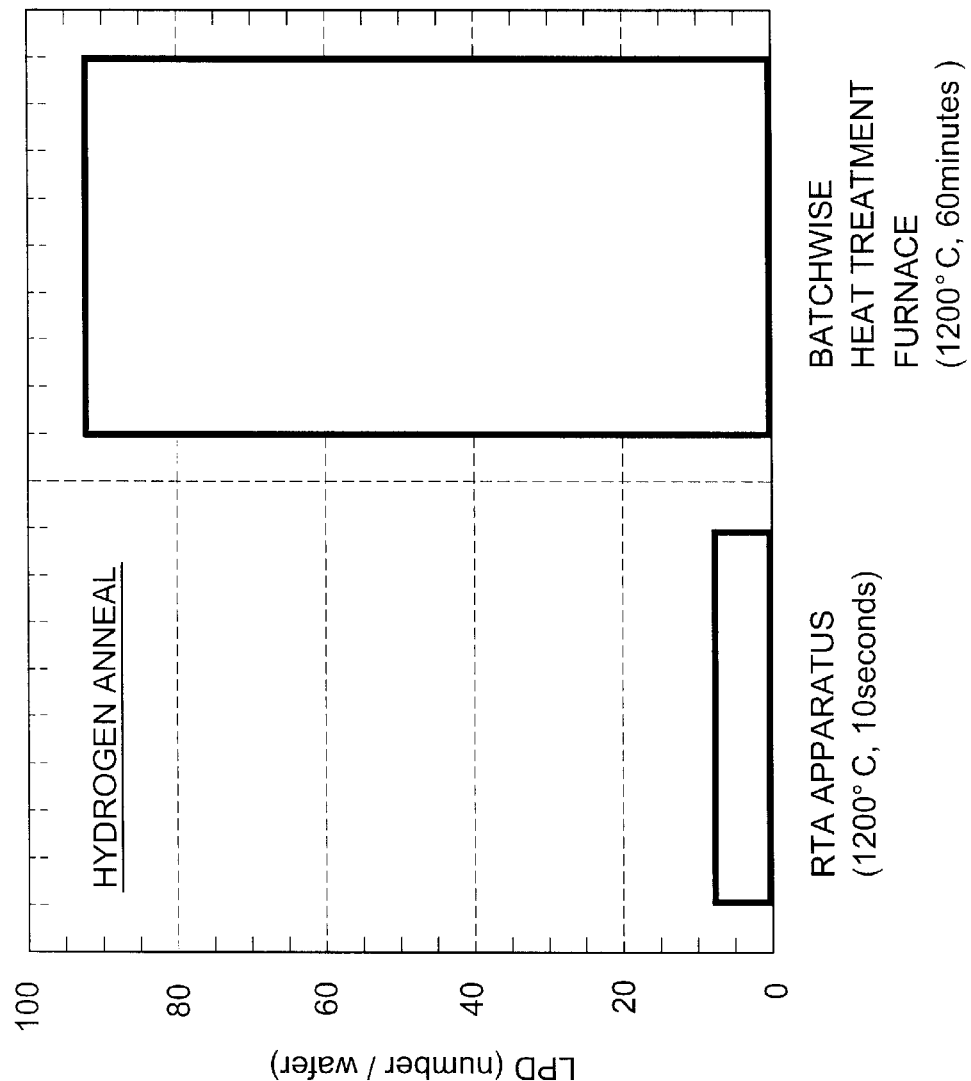
FIG. 3 is a graph showing a hydrogen anneal condition and comparison of the effect of hydrogen anneal with RTA apparatus with that with a batchwise heat treatment furnace.

With the pulling rate (SE) of the silicon monocrystal of 1.4 mm/min, the monocrystal ingot having oxygen concentration (Oi) of 16 ppma was pulled and wafers were prepared therefrom. Some of the wafers were then subjected to the hydrogen anneal at a temperature of 1200° C. for 10 seconds through use of RTA apparatus. The other of the wafers were subjected to the hydrogen anneal under the same condition for the above anneal with RTA apparatus except that a batchwise heat treatment furnace was used, and a treatment period was 60 minutes. The results were shown in a bar chart in FIG. 3. FIG. 3 shows that when the wafer was subjected to hydrogen anneal with RTA apparatus, the number of COPs existing at the surface layer portion of the wafer is significantly reduced to approximately 8 number/wafer, and therefore is quite advantageous compared with the wafer subjected to hydrogen anneal with a batchwise heat treatment apparatus (approximately 93 number/wafer).

The effect of hydrogen anneal with RTA apparatus to COPs at the surface layer portion of the wafer was compared with that with a batchwise heat treatment furnace through use of COPs measurement by the oxide film method. History of the wafer and hydrogen anneal condition were the same as those described above except that the oxygen concentration of the wafer was 12 ppma. Heat treatment of the wafer was conducted in the similar manner to Example 2, to grow oxide film having thickness up to 0.95 $\mu$m, and COPs were measured.

Figure 4:
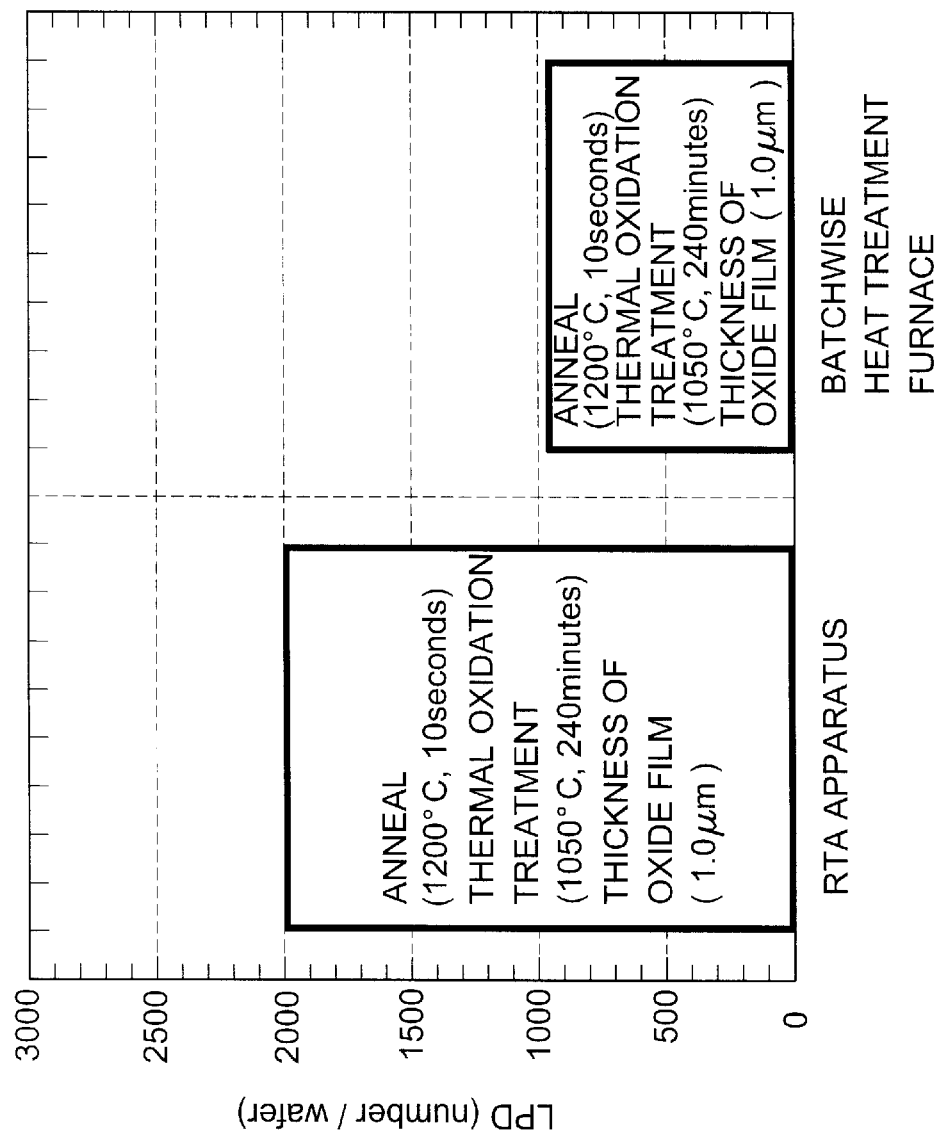
FIG. 4 is a graph comparing the number of LPD(COP) at the surface layer portion of the wafer obtained by subjecting to hydrogen anneal with a RTA apparatus and a batchwise apparatus.
Figure 5E:
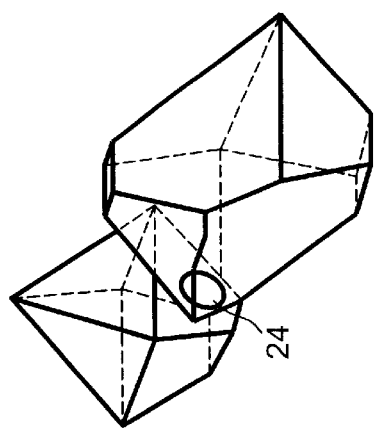
FIG. 5 is a schematic view showing the step that the twin type void is growing.
Figure 5D:
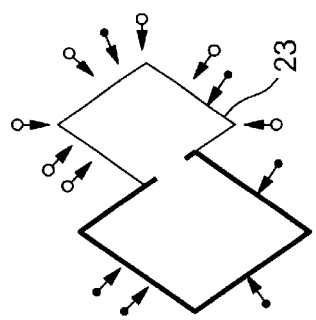
Figure 5C:
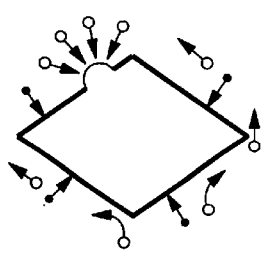
Figure 5B:
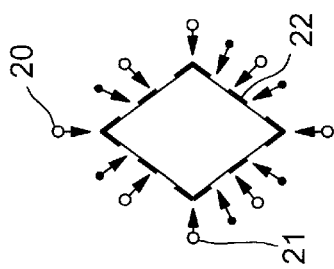
Figure 5A:
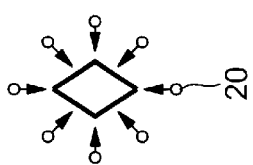

The results were shown in a bar chart in FIG. 4. FIG. 4 shows that when the wafer was subjected to hydrogen anneal with RTA apparatus, the number (integral value in depth direction) of LPD(COP) existing at the surface layer portion (in depth up to about 0.5 $\mu$m) of the wafer was approximately 2000 number/wafer, and the number of COPs at the surface layer portion of the wafer subjected to hydrogen anneal with a batchwise heat treatment furnace was 950 number/wafer. Therefore, it is advantageous to use a batchwise heat treatment furnace as for the number of COPs at the area in depth of up to about 0.5 $\mu$m from the surface of the wafer.

The present invention is not limited to the above-described embodiment. The above-described embodiment is a mere example, and those having the substantially same structure as that described in the appended claims and providing the similar action and effects are included in the scope of the present invention.

For example, in the above-described embodiment, a resistance heating type heat treatment furnace as shown in FIG. 6 is used. However, the present invention is not limited thereto. In principle, any apparatus may be used so long as it can heat and cool silicon monocrystal wafer rapidly and can heat the wafers to a temperature of 1200° C. or higher. For example, heat treatment can be conducted with a laser heater, X ray heater, a lamp heater, a batchwise heat treatment furnace.

What is claimed is:

1. A heat treatment method for a silicon monocrystal wafer, comprising the steps of growing a silicon monocrystal ingot on a condition that COPs exist on a whole surface thereof while controlling a growth rate and oxygen concentration by Czochralski method, obtaining a silicon monocrystal wafer in which COPs exist in a density of 0.64 numbers/cm$^2$ or more, manufactured by slicing the monocrystal ingot, and heat-treating in a reducing atmosphere the silicon monocrystal wafer in which COPs exist in a density of 0.64 numbers/cm$^2$ or more, at 1200° C. or above for one second or more through use of a rapid heating/rapid cooling apparatus.

2. The heat treatment method for a silicon monocrystal wafer according to claim 1, wherein the size of the COP existing in the silicon monocrystal to be subjected to said heat treatment is 60–130 nm.

3. The heat treatment method for a silicon monocrystal wafer according to claim 2, wherein said COP consists of only one void.

4. The heat treatment method for a silicon monocrystal wafer according to claim 1, wherein said COP consists of only one void.

5. The heat treatment method for a silicon monocrystal wafer according to claim 1 wherein said reducing atmosphere is 100%-hydrogen atmosphere, or a mixed atmosphere of hydrogen and argon.

6. The heat treatment method for a silicon monocrystal wafer according to claim 1, wherein the silicon monocrystal is grown by controlling a growth rate of faster than 0.8 mm/min and an oxygen concentration of 16 ppma or less.

7. A heat treatment method for a silicon monocrystal wafer, comprising the steps of growing a silicon monocrystal ingot on a condition that COPs exist on a whole surface thereof while controlling a growth rate and oxygen concentration by Czochralski method, obtaining a silicon monocrystal wafer in which COPs exist in a density of 0.64 numbers/cm$^2$ or more, manufactured by slicing the monocrystal ingot, and heat-treating in a reducing atmosphere the silicon monocrystal wafer in which COPs exist in a density of 0.64 numbers/cm$^2$ or more, at 1200° C. or above for 30 minutes or more through use of a batchwise heat treatment furnace.

8. The heat treatment method for a silicon monocrystal wafer according to claim 7, wherein the size of the COP existing in the silicon monocrystal to be subjected to said heat treatment is 60–130 nm.

9. The heat treatment method for a silicon monocrystal wafer according to claim 8, wherein said COP consists of only one void.

10. The heat treatment method for a silicon monocrystal wafer according to claim 7, wherein said COP consists of only one void.

11. The heat treatment method for a silicon monocrystal wafer according to claim 7 wherein said reducing atmosphere is 100%-hydrogen atmosphere, or a mixed atmosphere of hydrogen and argon.

12. The heat treatment method for a silicon monocrystal wafer according to claim 7, wherein the silicon monocrystal is grown by controlling a growth rate of faster than 0.8 mm/min and an oxygen concentration of 16 ppma or less.

13. A heat treatment method of a silicon monocrystal wafer wherein the silicon wafer having COPs of a size of 60–130 nm existing on a whole surface thereof is subjected to heat treatment in a reducing atmosphere at a temperature of 1200° C. or above.

14. The heat treatment method for a silicon monocrystal wafer according to claim 13 wherein said reducing atmosphere is 100%-hydrogen atmosphere, or a mixed atmosphere of hydrogen and argon.

15. A heat treatment method of a silicon monocrystal wafer wherein the silicon wafer wherein COP existing on a whole surface thereof is crystal defect consisting of only one void is subjected to a heat treatment in a reducing atmosphere at a temperature of 1200° C. or above.

16. The heat treatment method for a silicon monocrystal wafer according to claim 15 wherein said reducing atmosphere is 100%-hydrogen atmosphere, or a mixed atmosphere of hydrogen and argon.

* * * * *